US010615798B2

(12) United States Patent
Gans

(10) Patent No.: US 10,615,798 B2
(45) Date of Patent: Apr. 7, 2020

(54) APPARATUSES AND METHODS FOR IDENTIFYING MEMORY DEVICES OF A SEMICONDUCTOR DEVICE SHARING AN EXTERNAL RESISTANCE

(71) Applicant: Micron Technology, Inc., Boise, ID (US)

(72) Inventor: Dean Gans, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/008,955

(22) Filed: Jun. 14, 2018

(65) Prior Publication Data
US 2019/0131972 A1 May 2, 2019

Related U.S. Application Data

(60) Provisional application No. 62/578,847, filed on Oct. 30, 2017.

(51) Int. Cl.
*H03K 19/0185* (2006.01)
*G06F 13/40* (2006.01)
(Continued)

(52) U.S. Cl.
CPC .. *H03K 19/018585* (2013.01); *G06F 13/4086* (2013.01); *G11C 7/02* (2013.01);
(Continued)

(58) Field of Classification Search
CPC ........ H03K 19/018585; H03K 19/0005; G06F 13/4086; G11C 7/02; G11C 29/50008;
(Continued)

(56) References Cited

U.S. PATENT DOCUMENTS 4,511,959 A   4/1985 Nicolas et al.
4,745,548 A   5/1988 Blahut
              (Continued)

FOREIGN PATENT DOCUMENTS

JP   2009237678 A    10/2009
KR   20070036578 A   4/2007
              (Continued)

OTHER PUBLICATIONS

International Search Report and Written Opinion dated Oct. 30, 2018 for PCT application No. PCT/US2018/042722, 18 pages.
(Continued)

*Primary Examiner* — Daniel D Chang
(74) *Attorney, Agent, or Firm* — Dorsey & Whitney LLP

(57) ABSTRACT

Apparatuses and methods for identifying memory devices of a semiconductor device sharing an external resistance are disclosed. A memory device of a semiconductor device may be set in an identification mode and provide an identification request to other memory devices that are coupled to a common communication channel. The memory devices that are coupled to the common communication channel may share an external resistance, for example, for calibration of respective programmable termination components of the memory devices. The memory devices that receive the identification request set a respective identification flag which can be read to determine which memory devices share an external resistance with the memory device having the set identification mode.

17 Claims, 6 Drawing Sheets

(51) Int. Cl.
*G11C 29/02* (2006.01)
*G11C 29/50* (2006.01)
*G11C 7/02* (2006.01)
*H03K 19/00* (2006.01)
*G11C 7/04* (2006.01)
*G11C 29/44* (2006.01)

(52) U.S. Cl.
CPC ............ *G11C 29/02* (2013.01); *G11C 29/022* (2013.01); *G11C 29/028* (2013.01); *G11C 29/50008* (2013.01); *H03K 19/0005* (2013.01); *G11C 7/04* (2013.01); *G11C 2029/4402* (2013.01); *G11C 2207/2254* (2013.01)

(58) Field of Classification Search
CPC .... G11C 29/02; G11C 7/04; G11C 2207/2254
See application file for complete search history.

(56) References Cited

U.S. PATENT DOCUMENTS

| | | | |
|---|---|---|---|
| 4,986,183 A | 1/1991 | Jacob et al. | |
| 6,661,860 B1 | 12/2003 | Gutnik et al. | |
| 6,836,144 B1 | 12/2004 | Bui et al. | |
| 7,039,824 B2 | 5/2006 | Simon et al. | |
| 7,215,128 B2 | 5/2007 | Fujisawa | |
| 7,269,043 B2 | 9/2007 | Lee | |
| 7,432,731 B2 | 10/2008 | Bains et al. | |
| 7,436,202 B2 | 10/2008 | Lin et al. | |
| 7,443,193 B1 | 10/2008 | Santurkar et al. | |
| 7,973,553 B1 | 7/2011 | Wang et al. | |
| 7,990,174 B2 | 8/2011 | Park | |
| 9,318,183 B2 | 4/2016 | Ware et al. | |
| 9,531,382 B1 | 12/2016 | Miwa et al. | |
| 9,666,245 B2 | 5/2017 | Arai et al. | |
| 9,711,189 B1 | 7/2017 | Wang et al. | |
| 9,740,269 B1 | 8/2017 | Tatapudi et al. | |
| 9,766,831 B2 | 9/2017 | Gans | |
| 9,767,921 B1 | 9/2017 | Pan | |
| 9,825,631 B1 | 11/2017 | Cho et al. | |
| 10,090,064 B2 | 10/2018 | Pan | |
| 10,193,711 B2 | 1/2019 | Wieduwilt et al. | |
| 10,205,451 B1 | 2/2019 | Johnson | |
| 2003/0126356 A1 | 7/2003 | Gustavson et al. | |
| 2003/0235084 A1 | 12/2003 | Zumkehr et al. | |
| 2004/0128429 A1 | 7/2004 | Khandekar et al. | |
| 2004/0174185 A1 | 9/2004 | Lin et al. | |
| 2004/0240255 A1 | 12/2004 | Smith et al. | |
| 2005/0040845 A1 | 2/2005 | Park | |
| 2005/0226080 A1 | 10/2005 | Lee | |
| 2006/0158198 A1 | 7/2006 | Fujisawa | |
| 2008/0054935 A1 | 3/2008 | Pan | |
| 2008/0068040 A1 | 3/2008 | Morishima et al. | |
| 2008/0198666 A1 | 8/2008 | Nygren | |
| 2009/0009212 A1 | 1/2009 | Brox | |
| 2009/0224802 A1 | 9/2009 | Hollis et al. | |
| 2011/0128038 A1 | 6/2011 | Ko | |
| 2011/0283060 A1 | 11/2011 | Ware et al. | |
| 2013/0015880 A1 | 1/2013 | Haraguchi | |
| 2013/0036253 A1* | 2/2013 | Baltar ................. G06F 12/0246 711/103 |
| 2013/0088257 A1 | 4/2013 | Hara | |
| 2013/0113517 A1 | 5/2013 | Ko | |
| 2013/0311717 A1 | 11/2013 | Kim et al. | |
| 2013/0335114 A1 | 12/2013 | Chen et al. | |
| 2014/0097911 A1 | 4/2014 | Kaiwa et al. | |
| 2014/0185384 A1 | 7/2014 | Kim et al. | |
| 2014/0185401 A1 | 7/2014 | Yang et al. | |
| 2015/0019831 A1 | 1/2015 | Van Huben et al. | |
| 2015/0067292 A1 | 3/2015 | Grunzke | |
| 2015/0270010 A1 | 9/2015 | Kang | |
| 2015/0340069 A1 | 11/2015 | Arai et al. | |
| 2015/0364177 A1 | 12/2015 | Lee | |
| 2016/0042769 A1 | 2/2016 | Moran | |
| 2017/0109091 A1* | 4/2017 | Gans ..................... G06F 3/0604 |
| 2017/0109249 A1 | 4/2017 | Tatapudi et al. | |
| 2017/0162238 A1 | 6/2017 | Lee et al. | |
| 2017/0228010 A1 | 8/2017 | Tatapudi et al. | |
| 2017/0351451 A1 | 12/2017 | Gans | |
| 2018/0167055 A1 | 6/2018 | Gans | |
| 2018/0190368 A1 | 7/2018 | Pan | |
| 2018/0375692 A1 | 12/2018 | Wieduwilt et al. | |
| 2019/0036740 A1 | 1/2019 | Wieduwilt et al. | |
| 2019/0238133 A1 | 8/2019 | Johnson | |

FOREIGN PATENT DOCUMENTS

| | | |
|---|---|---|
| KR | 1020070088845 A | 8/2007 |
| KR | 1020080002692 A | 1/2008 |
| KR | 1020120087662 A | 8/2012 |
| TW | 201225079 A | 6/2012 |
| TW | 201532051 A | 8/2015 |
| TW | 201640358 A | 11/2016 |
| WO | 2010144624 A1 | 12/2010 |
| WO | 2018107076 A1 | 6/2018 |
| WO | 2018125293 A1 | 7/2018 |

OTHER PUBLICATIONS

PCT Application No. PCT/US18/39008, titled "Timing Based Arbitration Methods and Apparatuses for Calibrating Impedances of a Semiconductor Device", filed Jun. 22, 2018.

PCT Application No. PCT/US2018/042722, titled "Apparatuses and Methods for Identifying Memory Devices of a Semiconductor Device Sharing an External Resistance" filed on Jul. 18, 2018.

U.S. Appl. No. 16/034,233, titled "Methods and Apparatuses for Dynamic Step Size for Impedance Calibration of a Semiconductor Device" filed Jul. 12, 2018.

U.S. Appl. No. 15/630,901, entitled "Timing Based Arbitration Methods and Apparatuses for Calibrating Impedances of a Semiconductor Device" filed Jun. 22, 2017.

U.S. Appl. No. 15/683,439, entitled "Timing Based Arbiter Systems and Circuits for ZQ Calibration", filed on Aug. 22, 2017.

U.S. Appl. No. 15/882,723 entitled 'Methods and Apparatuses for Dynamic Step Size for Impedance Calibration of a Semiconductor Device' filed on Jan. 29, 2018.

U.S. Appl. No. 15/834,892 entitled "Apparatuses and Methods for Calibrating Adjustable Impedances of a Semiconductor Device", filed Dec. 7, 2017.

Singh, et al., "Mousetrap: High-Speed Transition-Signaling Asynchronous Pipelines", IEEE Transactions on Very Large Scale Integration (VLSI) Systems, vol. 15, No. 6, Jun. 2007, 15 pages.

U.S. Appl. No. 16/505,369 titled "Apparatuses and Methods for Calibrating Adjustable Impedances of a Semiconductor Device" filed Jul. 8, 2019.

* cited by examiner

| OP[7] | OP[6] | OP[5] | OP[4] | OP[3] | OP[2] | OP[1] | OP[0] |
|---|---|---|---|---|---|---|---|
| ZQ ID Flag | ZQ Master | ZQ ID Mode | ZQ Interval | | | ZQ Stop | ZQ Reset |

APPARATUSES AND METHODS FOR IDENTIFYING MEMORY DEVICES OF A SEMICONDUCTOR DEVICE SHARING AN EXTERNAL RESISTANCE

CROSS-REFERENCE TO RELATED APPLICATION

This application claims the filing benefit of U.S. Provisional Application No. 62/578,847, filed Oct. 30, 2017. This application is incorporated by reference herein in its entirety and for all purposes.

BACKGROUND

Semiconductor devices such as microcomputers, memories, gate arrays, among others, include input/output pins and an output circuit for transmitting data to other devices, via a bus, transmission lines formed on a board, and the like. A circuit within the semiconductor device that is responsible for transmitting data includes, for example, output buffers and drivers. For there to be optimum transmission, the impedance of the transmitting device should be matched to the impedance of the transmission network and receiving device.

As operational speeds of electronic devices increase, the swing of transmitted signals decreases. However, as the signal swing width of a transmitted signal decreases, the negative effect of external noise increases. External noise can affect the reflection characteristics of an output signal if there is an impedance mismatch at an interface. Impedance mismatches are caused by external noise or by noise on a power supply voltage, temperature and process variations, among others. If an impedance mismatch arises, the transmission speed of the data decreases, and the data from a semiconductor device may become distorted. Thus, in a case where a semiconductor device receives distorted data, problems can be caused by setup/hold failures or errors in reading received data.

DETAILED DESCRIPTION

In order to mitigate these issues arising from an impedance mismatch arises, memory devices may include programmable termination components that may be used to provide adjustable on-die termination and adjustable output driver impedance. The on-die termination may be adjusted to reduce impedance mismatch, for example, when signals (e.g., command, data, etc.) are provided to the memory devices. The programmable termination components have impedance values that can be adjusted as operating conditions change. In some implementations, programmable termination components are calibrated to a known impedance which may be based on voltage measurements made on a circuit node that couples to an external resistance.

Calibration of the programmable termination components typically occurs in response to a memory command, which is provided to the memory device, for example, at power up, memory device reset, changing a frequency set point for memory device operation, or whenever initiating a calibration process is desired. Following a time period after the initiation of the calibration process, another memory command is provided to the memory device to apply the parameters determined during the calibration process to set the programmable termination components accordingly.

In some cases, a limited number of external connections are available for coupling to an external resistance. These external connections may be shared between multiple devices that use the connection for calibration purposes. However, it may not be apparent to devices external to the memory, such as a system memory controller, which of the multiple devices of the memory share each of the external connections. As such, devices external to the memory may be unable to determine which devices in the memory to send commands for calibration operations. To address this, and as described herein, a memory device of a semiconductor device may be set in an identification mode and provide an identification request to other memory devices that are coupled to a common communication channel.

Figure 1:
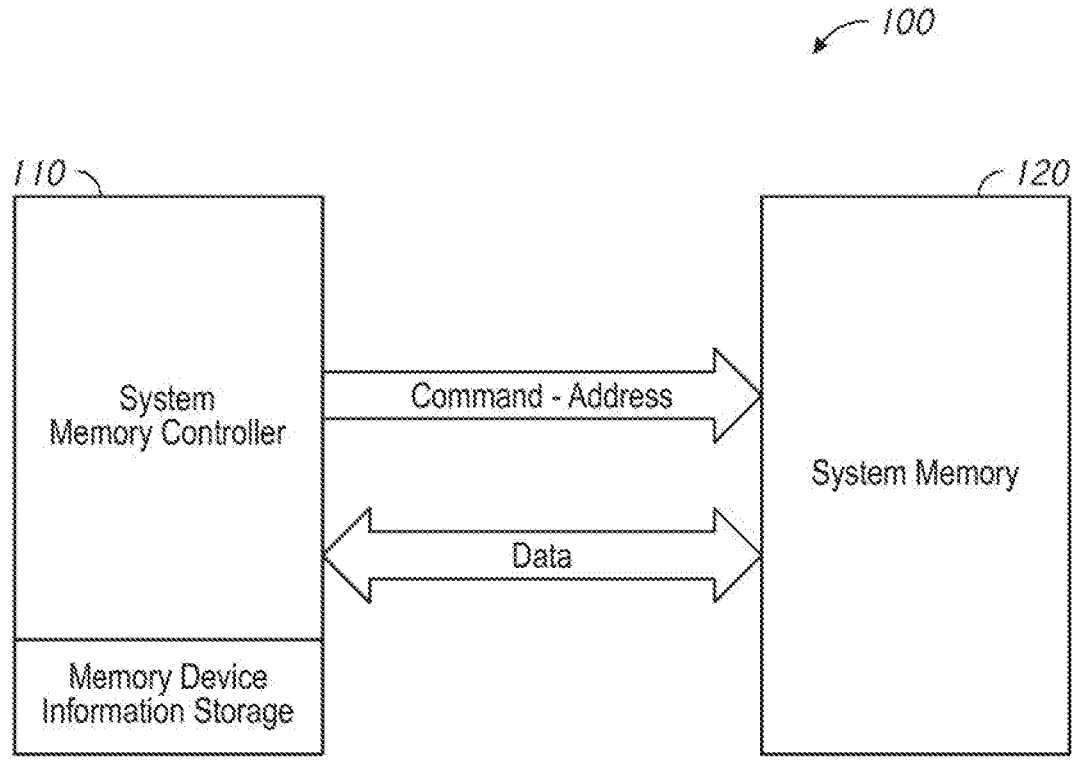
FIG. 1 is a block diagram of a system according to an embodiment of the disclosure.

FIG. 1 is a block diagram of a system 100 according to an embodiment of the disclosure. The system 100 includes a system memory controller 110 and a system memory 120. The system memory controller 110 and the system memory 120 may communicate with each other over command-address bus 130 and a data bus 140. The system memory controller 110 may control the system memory 120 by issuing commands and memory addresses associated with the commands over the command-address bus 130, for example, to store data and to provide data. Data may be stored by the system memory controller 110 by issuing a write command to the system memory 120 and providing write data on the data bus 140 to the system memory 120 to be stored. Data may be provided to the system memory controller 110 by issuing a read command to the system memory 120, which provides the requested read data on the data bus 140 to the system memory controller 110.

The system memory 120 may include multiple semiconductor devices that may be accessed to store data and provide data when requested. The system memory controller 110 may include multiple memory controllers, each communicating with and having access to a respective portion of the system memory 120. The system memory controller may further include memory device information storage for storing information related to memory devices of the semiconductor devices of the system memory 120.

Figure 2:
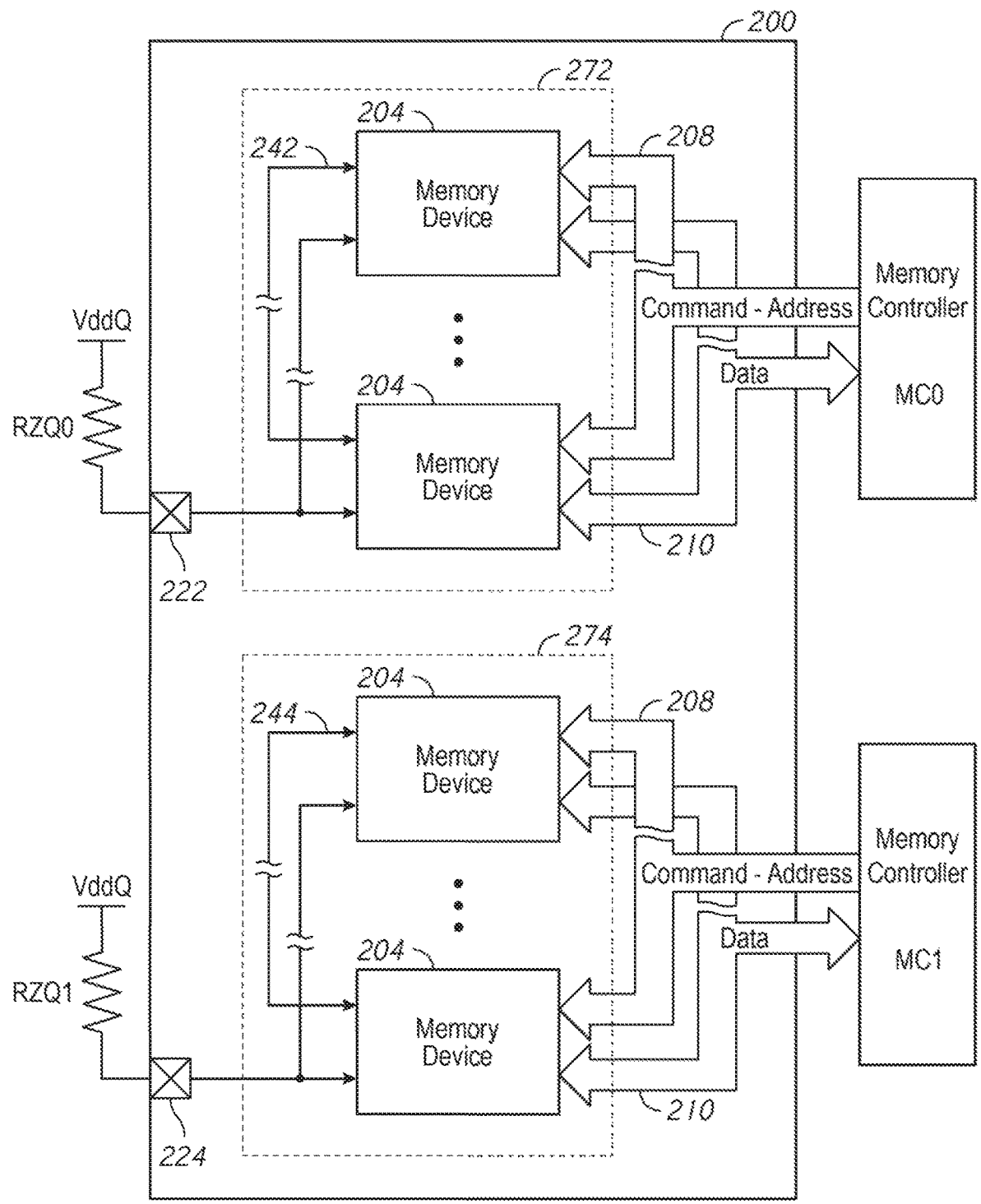
FIG. 2 is a block diagram of a semiconductor device according to an embodiment of the disclosure.

FIG. 2 is a block diagram of a semiconductor device 200 according to an embodiment of the disclosure. The semiconductor device 200 may be a volatile memory such as a SRAM or DRAM, or a non-volatile memory such as a FLASH memory or a ferroelectric memory. In one embodiment, the Double Data Rate (DDR) memory, such as a Low Power Double Data Rate 5 (LPDDR5) memory. The semiconductor 200 may be included in the system memory 120 of FIG. 1 in some embodiments of the disclosure.

The semiconductor device 200 includes a plurality of individual memory devices 204 that may be arranged on one or more different semiconductor dies, and further includes a package that contains and interconnects the various individual memory devices 204. The package may provide a plurality of external pins that couple to contact pads arranged on the interior of the package. The pins and pads may provide electrical connections such as between the memory devices 204 and the larger system to which the semiconductor device 200 is coupled. The semiconductor device 200 may include memory buses through which the larger system communicates with the memory devices 204. For example, the semiconductor device 200 may be associated with one or more memory controllers that are configured to communicate commands, addresses, and data with the semiconductor device 200 over the memory buses. Each memory controller may communicate across a respective memory bus that couples the memory controller to one or more individual memory devices 204 of the semiconductor device 200. For example, as shown in FIG. 2, a memory controller MC0 may communicate with a first group of memory devices 204 and a memory controller MC1 may communicate with a second group of memory devices 204 across respective memory busses. The memory controllers MC0 and MC1 may be included in a system memory controller (e.g., system memory controller 110 of FIG. 1) in some embodiments of the disclosure. The memory controllers MC0 and MC1 may be included in separate system memory controllers, or not included in a memory controller, in other embodiments of the disclosure.

Each memory bus may include a command-address bus 208 that provides commands and addresses to the semiconductor device 200 and may further include a data bus 210 over which data is provided. Each memory bus may additionally include chip select lines (not shown) that may be selectively asserted to enable one of the memory devices 204 to send or receive data across the common memory bus. The memory devices 204 may be configured in multiple different ways and the chip select lines configured accordingly to control selection of the memory devices 204. For example, in some embodiments of the disclosure, a two or more memory devices 204 are coupled to a common chip select line, whereas in other embodiments of the disclosure, each memory device 204 is coupled to a respective chip select lines. Some embodiments of the disclosure may include memory devices 204 that have respective chip select lines in combination with other memory devices 204 that have a common chip select line. Through the combination of individual chip select lines and common address, data, and control lines, the larger system may communicate and control the semiconductor device 200.

The semiconductor device 200 may also include first and second internal terminals, which may be referred to as ZQ terminals 222 and 224. A first external resistance RZQ0 may couple to the ZQ terminal 222 and a second external resistance RZQ1 may couple to the ZQ terminal 224. The memory devices 204 coupled to the ZQ terminal 222 to share the first external resistance RZQ0 for impedance calibration represent a first (ZQ) group 232. The memory devices 204 coupled to the ZQ terminal 224 to share the second external resistance RZQ1 for impedance calibration represent a second (ZQ) group 234. The memory devices 204 of the first ZQ group share a single ZQ resource (i.e., external resistance RZQ0) and the memory devices of the second ZQ group share a single ZQ resource (i.e., external resistance RZQ1). The memory devices 204 of the first ZQ group 232 are coupled to a communication channel 242 through which the memory devices 204 communicate with each other. Similarly, the memory devices 204 of the second ZQ group 234 are coupled to a communication channel 244 through which the memory devices 204 communicate with each other. For example, information or a request provided by one of the memory devices 204 of a ZQ group is received by the other memory devices 204 of the same ZQ group.

Due to multiple memory devices 204 of a memory group sharing one external resistance RZQ, contention may occur in the event that the first and second memory both devices 104 perform respective calibration operations concurrently. As a result, the memory devices 204 may need to arbitrate for use of the external resistance RZQ during calibration operations. For example, the semiconductor devices 204 of the first ZQ group 232 may need to arbitrate for use of the external resistance RZQ0 during calibration operations and obtain control over the external resistance RZQ0 before initiating calibration operations. Likewise, the semiconductor devices 204 of the second ZQ group 234 may need to arbitrate for use of the external resistance RZQ1 during calibrations operations and obtain control over the external resistance RZQ1 before initiating calibration operations.

FIG. 2 shows two ZQ groups as included in the semiconductor device 200. In other embodiments of the disclosure, a semiconductor device may include fewer or greater ZQ groups. Additionally, in some embodiments of the disclosure, each of the ZQ groups of the semiconductor device may include the same number of memory devices, whereas in other embodiments of the disclosure, two or more the ZQ groups may have different numbers of memory devices.

Figure 3:
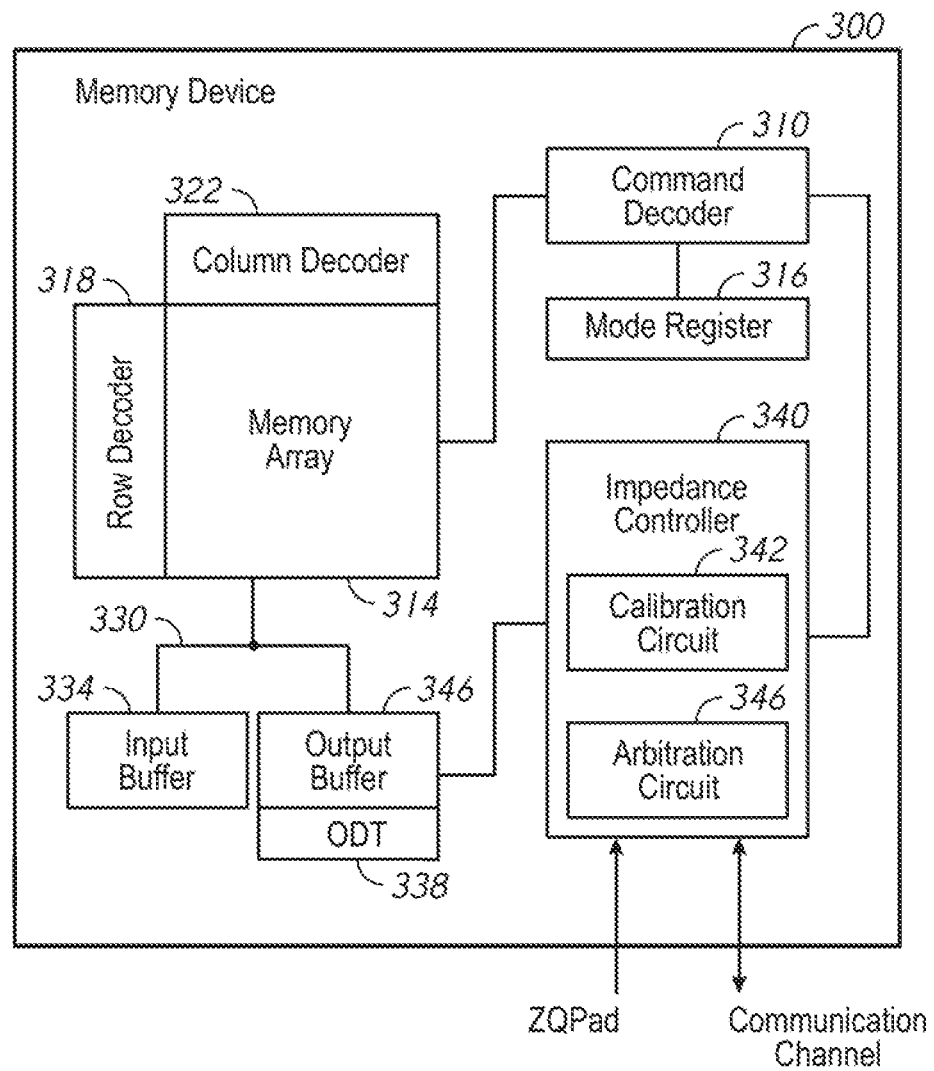
FIG. 3 is a block diagram of a memory device according to an embodiment of the disclosure.

FIG. 3 is a block diagram of a memory device 300 according to an embodiment of the disclosure. In some embodiments of the disclosure, the memory device 300 may be included in the semiconductor device 200 as the memory devices 204.

The memory device 300 includes a command decoder 310 that receives and processes commands from a memory bus. The command decoder 310 may be configured to recognize a plurality of commands that correspond to various operations that may be executed by the memory device 300. For example, the command decoder 310 may receive and decode a read or write command. A read or write command generally directs the memory device 300 to read or write data to or from one or more memory cells in a memory array 314. In performing a corresponding read or write operation, the command decoder 310 may provide internal control signals to read data from and write data to the memory array 314. Row and column address signals may be provided to an address latch in the memory device 300 through an address bus. The address latch may then provide a separate column address and a separate row address. The address latch may provide row and column addresses to a row address decoder 318 and a column address decoder 322, respectively. The row address decoder 318 may include signal line drivers that activate respective rows of memory cells in the array 314 corresponding to received row addresses. The column address decoder 322 may select signal lines extending through the array 314 corresponding to respective column addresses. The selected signal line or lines corresponding to a received column address may be coupled to read/write circuitry to provide read data to an output data buffer 326 via an input-output data path 330. Write data may be provided to the memory array 314 through an input data buffer 334 and the memory array read/write circuitry. A clock generator (not shown) may provide an internal clock signal responsive to an input clock signal. The internal clock signal may be used by circuits of the memory, for example, the output data buffer 326 and the input data buffer 334.

Calibration operations may be initiated by command, for example, from a system memory controller. Calibration operations may be initiated automatically, for example, as part of a power-on sequence that occurs when power is first provided to the memory device 300, and/or when there is a change in operating condition for the memory device 300.

A calibration command is generally issued to cause a memory device 300 to calibrate an impedance of each of programmable termination component 338, sometimes referred to as On Die Termination (ODT) and the output buffer 326. As known, an ODT circuit may be adjusted to provide a matched impedance. In FIG. 3, the programmable termination component 338 is depicted independently of the output buffer 326. However, it is also possible that the output buffer includes the programmable termination component 338 as a part of the output buffer. In this case, the ODT operation is performed by at least a part of the output buffer 326. Upon receipt, the command decoder 310 decodes the calibration command and provides control signals to an impedance controller 340, which generally operates to adjust impedances of the programmable termination component 338 and the output buffer 326. Each of the programmable termination component 338 and the output buffer 326 generally includes a group of pull-up and pull-down transistors that, are controlled to be enabled or disabled by the impedance controller 340. The impedance controller 340 enables/disables the pull-up and pull-down transistors on or off so that the impedance of the output buffer 326 matches the impedance of the data bus. In this way, signal reflections that result from impedance mismatches are avoided.

The impedance controller 340 may be coupled to an external resistance RZQ that is used for calibration of the impedances of the programmable termination component 338. The impedance controller 340 is also coupled to a communication channel. As previously described, memory devices of a ZQ group may be coupled to a communication channel to communicate with each other, for example, providing and receiving information and/or request. The impedance controller 340 includes a calibration circuit 342 and an arbitration circuit 346.

The calibration circuit 342 generally operates by measuring the voltage at a ZQ terminal and using that voltage to adjust the impedance of the programmable termination component 338 and the output buffer 326. When current is provided from the external resistance RZQ as part of a calibration operation, the current may be received by the calibration circuit 342. The impedance of the external resistance RZQ may represent the impedance that each of the programmable termination component 338 and the output buffer 326 provides to the data bus to which it is coupled. The impedance of each of the programmable termination component 338 and the output buffer 326 may vary as various operating conditions change. For example, temperature changes that occur during the operation of the memory device 300 may lead to variations in these impedances.

By measuring the impedance of the external resistance RZQ, of which impedance is basically stable regardless of changes in conditions, the calibration circuit 342 makes an impedance measurement that corresponds to current operating conditions. This impedance measurement may then be used to set the impedance value of each of the programmable termination component 338 and the output buffer 326 such that it matches current operating conditions. For example, the calibration circuit 342 may measure the voltage at the ZQ terminal and compare that voltage to an internal reference voltage. This comparison may be made through the operation of a comparator that outputs a comparison result. The comparison result may then be used to step up or step down the voltage at the ZQ terminal so as to bring the voltage of the ZQ pin closer to the reference voltage. This comparison process generates control codes that may be used to enable/disable the various pull down and pull up transistors associated with the programmable termination component 338 and the output buffer 326 to adjust the impedances properly. This process generally operates to match the output buffer 326 impedance with the external impedance that is represented by the external resistance RZQ.

The arbitration circuit 346 arbitrates for control of the external resistance RZQ that is shared among the memory devices of a ZQ group, for example, for a calibration operation. The arbitration circuit 346 may apply an arbitration scheme to avoid contention for the external resistance RZQ during impedance calibration.

The memory device 300 further includes a mode register 316. The mode register 316 may include registers that may be programmed to store information, such as binary digits (bits) of information. The information of the mode register 316 may be written or read, for example, through commands provided to the command decoder 310, such as by a system memory controller. Various memory device settings and options may be set through the use of the mode register 316. Bits of the mode registers 316 may correspond to different settings and options. The bits of the mode register 316 may be programmed through a mode register write operation, which is performed when a mode register write command is provided to the memory device 300, for example, from a memory system controller. The mode register 316 may also provide information regarding the status or settings of the memory device 300. The memory device 300 may program a bit or bits of the mode register 316 that correspond to a status or setting. The value of the bit(s) may indicate the status or setting. The bits of the mode register 316 may be read through a mode register read operation, which is performed when a mode register read command is provided to the memory device 300, for example, from a memory system controller. The memory device 300 provides the bits of the mode register 316 that are read as output data that may be received by the memory system controller. Based on the value of the mode register bits provided by the memory device 300, the status and/or settings of the memory device 300 are provided to the memory system controller.

Figures 4, 5:
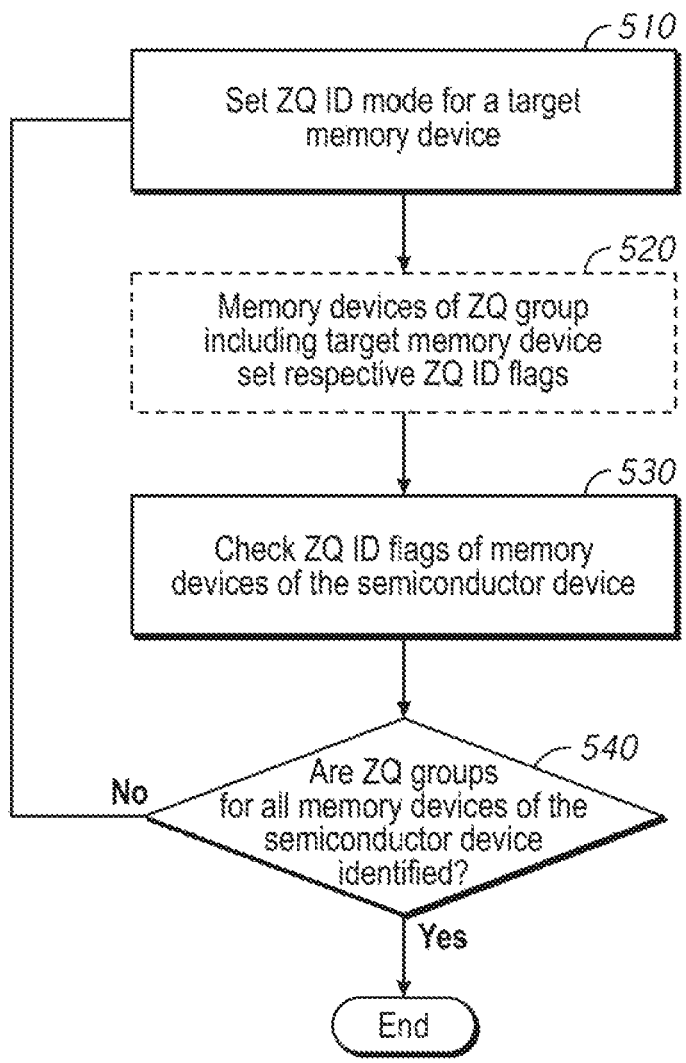
FIG. 4 is a diagram of a mode register including various settings and flags related to impedance calibration and impedance settings according to an embodiment of the disclosure
FIG. 5 is a flow diagram for identifying (ZQ) groups of memory devices sharing an external resistance and the memory devices included in each of the ZQ groups of a semiconductor device according to an embodiment of the disclosure.

FIG. 4 is a diagram of a mode register 400 including various settings and flags related to impedance calibration and impedance settings according to an embodiment of the disclosure. The mode register 400 is an 8-bit register including bits corresponding to operands OP[7:0]. The bits of the mode register 400 are designated as a particular setting or flag. For example, operand OP[0] is designated as ZQ Reset; operand OP[1] is designated as ZQ Stop; operands OP[4:2] are designated as ZQ Interval; operand OP[5] is designated as ZQ ID mode; operand OP[6] is designated as ZQ Master; and operand OP[7] is designated as ZQ ID Flag. The operands OP[6:0] may be set, for example, through a mode register write operation initiated by a system memory controller, and the operand OP[7] may be set by the memory device, for example, when the ZQ ID mode is set or when a ZQ ID request is received by the memory device.

The ZQ Reset of operand OP[0] has a default value of "0" to set a normal ZQ operation when the impedances of the memory device are set according to a ZQ code determined during a ZQ calibration operation, or may be set to a "1" to reset the ZQ code to a default setting. The ZQ Stop of operand OP[1] has a default value of "0" to, set normal operation of ZQ calibration or may be set to a "1" to halt a ZQ calibration operation. The ZQ Interval of operands OP[4:2] may be set to a three-bit value where the different values correspond to a ZQ calibration interval time for the calibration operations. The ZQ ID Mode of operand OP[5] has a default value of "0" to set normal ZQ operation or may be set to a "1" to set the identification mode ZQ ID Mode of operation. As will be described in more detail below, the ZQ ID Mode of operation causes a memory device of a ZQ group to provide an identification ZQ ID request to the other memory devices of the same ZQ group to set a respective ZQ ID Flag. As a result, all of the memory devices of a ZQ group set a respective identification flag ZQ ID Flag. The ZQ Master of operand OP[6] has a default value of "0" to indicate that the memory device is not a ZQ Master, or may be set to "1" to designate the memory device as the master of a ZQ group. The identification flag ZQ ID Flag of operand OP[7] has a default value of "0" for normal operation or may be set by the memory device to "1" responsive to being set in the ZQ ID Mode or receiving a ZQ ID request from another memory device in the same ZQ group.

As will be described in more detail below, the ZQ ID Mode, ZQ Master, and ZQ ID Flag of operands OP[7:5] may be used to identify the ZQ groups of a memory and identify the particular memory device(s) in each of the ZQ groups, and to set a die of the ZQ group as the ZQ master. The mode register 400 of FIG. 4 has been described as including particular settings and flags related to the impedance calibration and settings, and in a particular arrangement. However, the impedance calibration and settings and the arrangement of bits may be different in other embodiments of the disclosure. The scope of the disclosure is not limited to the particular details shown and described with reference to FIG. 4.

As previously described, a semiconductor device including multiple memory devices may have one or more ZQ terminals to which different respective groups of memory devices are coupled. Each ZQ terminal may be coupled to an external resistance RZQ that is shared by the multiple memory devices that are coupled to the ZQ terminal for impedance calibration. The memory devices that are coupled to a common ZQ terminal to share an external resistance RZQ for impedance calibration may be referred to as a ZQ group. Each ZQ group includes a memory device that is designated as the ZQ master. The ZQ master of a ZQ group may receive ZQ calibration commands and communicate with the memory devices of the ZQ group to perform ZQ calibration. Use of the shared external resistance RZQ by the memory devices of the ZQ group for ZQ calibration may be arbitrated by the ZQ master. For example, in some embodiments of the disclosure the impedance controller of the ZQ master may communicate with the other memory devices of the ZQ group over a communication channel (e.g., communication channel 242 of FIG. 2) to control the other memory devices to sequentially perform ZQ calibration until all of the memory devices are calibrated, thereby avoiding contention for use of the external resistance RZQ. In other embodiments, the ZQ master may control the memory devices of the ZQ group to perform ZQ calibration in another manner in order to complete ZQ calibration without contention for use of the external resistance RZQ.

The ZQ master memory device of a ZQ group may be designated by a system memory controller coupled to the memory devices of the ZQ group. In some embodiments of the disclosure, a memory device of a ZQ group is designated as the ZQ master by programming bit(s) of a mode register that correspond to the ZQ master setting (e.g., with reference to FIG. 4, setting ZQ Master of mode register 400 to "1"). For example, as a default setting for the memory device, the mode register bit(s) corresponding to the ZQ master setting has a value to indicate that the memory device is not the ZQ master (e.g., have a default "0" value for the mode register bit(s)). Thus, when the memory devices are initialized (e.g., power up, reset, etc.), none of the memory devices of a ZQ group are designated as the ZQ master. The system memory controller may issue (e.g., transmit, send, etc.) a mode register write command to a selected one of the memory devices of the ZQ group to program the mode register bit(s) corresponding to the ZQ master setting to have a value indicating that it is the ZQ master (e.g., program the corresponding mode register bit(s) to have a "1" value).

Once programmed, the selected memory device is designated as the ZQ master and serves the role, for example, by receiving ZQ calibration commands for the ZQ group and communicating with the other memory devices of the ZQ group accordingly to perform ZQ calibration.

As previously described, a semiconductor device may include multiple memory devices. One or more of the system memory controllers coupled to the semiconductor device perform a die enumeration operation to identify the memory devices of the semiconductor device. The system memory controllers perform die enumeration, for example, when the system memory controller and/or semiconductor device are initialized, such as at power up and/or reset of the system memory controller and/or semiconductor device. Following enumeration of the memory devices of the semiconductor device, the system memory controller may store memory device information related to the identification of the memory devices, for example, the number of memory devices in the semiconductor device, a unique identification value for each of the memory devices, etc. The memory device information may be stored in a storage included in the system memory controller. In some embodiments, the memory device information may be stored in the format of a memory map. For example, the memory map may list all of the memory devices identified in the semiconductor device along with any additional information that may be related for each of the memory devices. Other formats for storing the memory device information, as well as the type of information stored, may be different without departing from the scope of the disclosure.

While the system memory controller may obtain memory device information about the memory devices of the semiconductor device through a die enumeration operation, for example, identifying the number of memory devices, the arrangement of the memory devices into ZQ groups may not be apparent to a system memory controller. As such, the system memory controller may not be able to determine which memory devices to designate as ZQ masters.

FIG. 5 is a flow diagram for identifying the ZQ groups and the memory devices included in each of the ZQ groups of a semiconductor device according to an embodiment of the disclosure. A system memory controller may follow the flow diagram to identify the ZQ groups and the memory devices included in each of the ZQ groups, for example, as part of a startup and/or reset routine.

Prior to 510, the memory devices of the semiconductor device have been enumerated so that a system memory controller has identified each memory device of the semiconductor device. However, the system memory controller has not identified the ZQ groups of the semiconductor device or the memory devices included in each of the ZQ groups.

At 510 the system memory controller sets an identification mode (e.g., ZQ ID mode) for a target memory device of the semiconductor device. In some embodiments of the disclosure, the ZQ ID mode may be set through a mode register (e.g., setting ZQ ID Mode of operand OP[5] of mode register 400 to "1"). The system memory controller may issue (e.g., transmit, send, etc. signals representing) a mode register write command to have a "1" written to the corresponding operand of the mode register. The target memory device may be any of the memory devices of the semiconductor device. However, for the sake of efficiency, the target memory device may be a memory device of the semiconductor device that has not yet been identified as being included in any ZQ group that has been already identified to that point. Following the setting of the ZQ ID mode for the target memory device, the system memory controller may perform other operations. The target memory device and the other memory devices in the same ZQ group as the target memory device set a respective identification flag (e.g., ZQ ID Flag), as shown by 520. As a result, all the memory devices of one ZQ group set their respective ZQ ID Flags. In some embodiments of the disclosure, the ZQ ID Flag of a memory device may be represented by bit(s) of a mode register. The ZQ ID Flag may be set by the memory device programming a value (e.g., "1" value) for mode register bit(s) corresponding to the ZQ ID Flag (e.g., setting ZQ ID Flag of operand OP[7] of the mode register 400 to "1").

At 530 the system memory controller checks the ZQ ID Flags of the memory devices of the semiconductor device. Those memory devices having a set ZQ ID Flag are identified as being included in a same ZQ group. The system memory controller may update stored memory device information (e.g., a memory map) to record the memory devices included in the identified ZQ group. In embodiments of the disclosure where the ZQ ID Flag is represented by a mode register bit(s), the system memory controller may check the ZQ ID Flags of the memory devices using a mode register read operation. The system memory controller may issue a mode register read command to each of the memory devices being checked (e.g., transmit, send, etc. signals representing the mode register read command) to read the data of an opcode corresponding to the ZQ ID Flag. In response to the mode register read commands, the memory devices provide (e.g., transmit, send, etc.) the value of the ZQ ID Flag to the system memory controller. Those memory devices having a set ZQ ID Flag (e.g., provide a "1" for the corresponding mode register bit responsive to the mode register read command) are identified as being included in the same ZQ group. Those memory devices having a ZQ ID Flag that is not set (e.g., provide a "0" for the corresponding mode register bit responsive to the mode register read command) are identified as not being included in that ZQ group.

At 540 the system memory controller determines whether all of the ZQ groups for the semiconductor device have been identified.

All of the ZQ groups of a semiconductor device have been identified when all of the memory devices of the semiconductor device have been identified as being associated with a ZQ group, for example. If all of the ZQ groups of the semiconductor device have been identified, the process for identifying the ZQ groups of the semiconductor device is complete. However, if not all of the ZQ groups of the semiconductor device have been identified, the system memory controller returns to 510 to set the ZQ ID mode for another targeted memory device (e.g., a memory device that has not yet been identified as associated with a ZQ group) of the semiconductor device to repeat the flow diagram.

Figure 6:
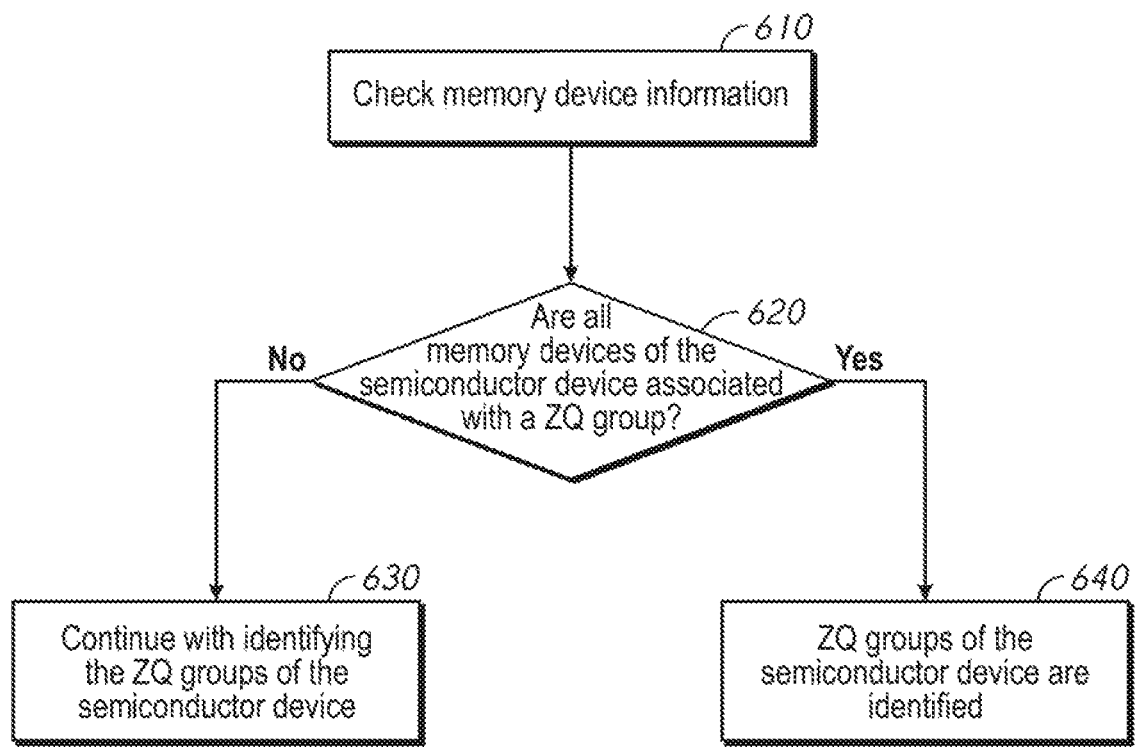
FIG. 6 is a flow diagram of determining whether all of the ZQ groups of a semiconductor device have been identified according to an embodiment of the disclosure.

FIG. 6 is a flow diagram of determining whether all of the ZQ groups of a semiconductor device have been identified according to an embodiment of the disclosure. As previously described, the system memory controller determines the status of the ZQ ID Flags for the memory devices being checked. For example, in some embodiments of the disclosure, the ZQ ID Flag of the memory devices may be checked by issuing (e.g., transmits, sends, etc. signals representing) a mode register read command to the memory devices. As the system memory controller checks the ZQ ID Flags of the memory devices, the system memory controller updates stored memory device information that shows identified ZQ groups, and the particular memory devices included in the identified ZQ groups. As previously described, the memory device information may include the number of memory devices in the semiconductor device, a unique identification value for each memory device, etc. As also previously described, the memory device information may be stored in a memory map format in some embodiments of the disclosure. Other techniques for storing the memory device information may be used in other embodiments of the disclosure.

At 610 the system memory controller accesses the stored memory device information to check for any memory devices that have not yet been associated with a ZQ group. At 620, the system memory controller determines if the memory device information indicates that not all of the memory devices of the semiconductor device are associated with a ZQ group, which indicates that there is at least one additional ZQ group for the remaining memory devices in the semiconductor device. Consequently, at 630 identification of the ZQ groups of the semiconductor device continues (e.g., follow the flow diagram of FIG. 5). Conversely, if the system memory controller determines that the memory device information identifies every memory device of the semiconductor device as being associated with a ZQ group, at 640 all of the ZQ groups of the semiconductor device have been identified.

Figure 7:
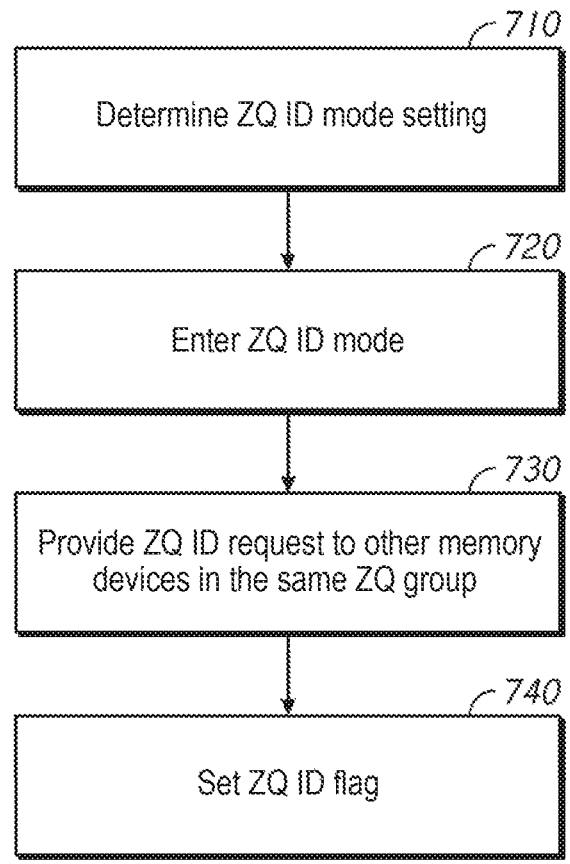
FIG. 7 is a flow diagram of a ZQ ID mode operation for a memory device according to an embodiment of the disclosure.

FIG. 7 is a flow diagram of a ZQ ID mode operation for a memory device according to an embodiment of the disclosure. The ZQ ID mode operation may be performed by a memory device that has been targeted by system memory controller that is identifying ZQ groups of a semiconductor device, for example, in response to a ZQ ID mode being set by the system memory controller.

At 710 a target memory device determines whether the ZQ ID mode has been set. In some embodiments of the disclosure, the ZQ ID mode is set in a mode register (e.g., setting ZQ ID mode of operand OP[5] of mode register 400 to "1"), for example, by a system memory controller. The system memory controller issues a mode register write command to the target memory device, and programs the bit(s) corresponding to the ZQ ID mode to set the mode. The target memory device determines the setting of the ZQ ID mode following the programming of the corresponding bit(s) in the mode register by the system memory controller.

At 720 the target memory device enters the ZQ ID mode responsive to determining that the ZQ ID mode is set, and at 730 provides (e.g., transmits, sends, etc. signals representing) an identification request (e.g., ZQ ID request) to the other memory devices in the same ZQ group. The ZQ ID request may be provided to the other memory devices on a communication channel to which all the memory devices of the ZQ group are coupled (e.g., communication channel 242 of FIG. 2). A response according to an embodiment of the disclosure by the other memory devices in the same ZQ group as the target memory device will be described with reference to FIG. 8.

Along with providing the ZQ ID request to the other memory devices in the same ZQ group, the target memory device sets its ZQ ID Flag at 740. In some embodiments of the disclosure, the ZQ ID Flag is represented by a bit(s) of a mode register (e.g., setting ZQ ID Flag of operand OP[7] of mode register 400 to "1"). The ZQ ID Flag is set by the target memory device by changing a value of the corresponding mode register bit(s) to a "set" value, for example, a "1" value. The value of the mode register bit(s) representing the ZQ ID Flag may be read by the system memory controller issuing a mode register read command to the target memory device.

Figure 8:
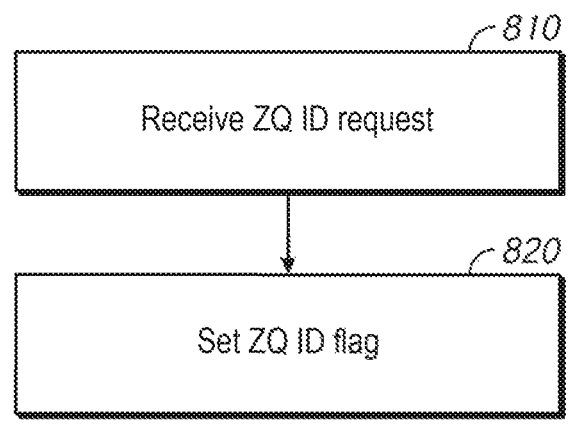
FIG. 8 is a flow diagram of a ZQ ID request operation for a memory device according to an embodiment of the disclosure.

FIG. 8 is a flow diagram of a ZQ ID request operation for a memory device according to an embodiment of the disclosure. The ZQ ID request operation may be performed by a memory device that has received a ZQ ID request.

At 810 a memory device receives a ZQ ID request. The ZQ ID request may be received on a communication channel (e.g., communication channel 242 of FIG. 2). As previously described, memory devices of a ZQ group are coupled to the communication channel. The ZQ ID request may have been provided, for example, by another memory device of the same ZQ group that had the ZQ ID mode set (e.g., a target memory device). At 820, the memory device that receives the ZQ ID request sets its ZQ ID Flag. As previously described, in some embodiments of the disclosure, the ZQ ID Flag is represented by a bit(s) of a mode register, and the ZQ ID Flag may be set by programming a value of the corresponding mode register bit(s) to a "set" value, for example, a "1" value (e.g., setting ZQ ID Flag of operand OP[7] of mode register 400 to "1").

Generally, following the setting of a ZQ ID mode of a target memory device by the system memory controller, the system memory controller can query the ZQ ID Flags of the memory devices of the semiconductor device to identify which memory devices are in the same ZQ group as the target memory device. In particular, all of the memory devices having a set ZQ ID Flag (e.g., a "1" value for the corresponding mode register bit(s)) are included in the same ZQ group as the target memory device. Conversely, all of the memory devices having a ZQ ID Flag that is not set (e.g., a "0" value for the corresponding mode register bit(s)) are not included in the ZQ group of the target memory device. The system memory controller may update stored memory device information to record the memory devices included in the ZQ group. The system memory controller may check the ZQ ID Flag, for example, of all of the memory devices of the semiconductor device. In another example, the system memory controller may check the ZQ ID Flag of the memory devices that have not yet been associated with a ZQ group.

Following identification of the ZQ groups of a semiconductor device and identification of the memory devices associated with each of the ZQ groups, a memory device of each ZQ group may be designated as the ZQ master for the respective ZQ group, for example, by a system memory controller. As previously described, each ZQ group may have a memory device that is designated as the ZQ master. The ZQ master of a ZQ group may receive ZQ calibration commands and communicate with the memory devices of the ZQ group to perform ZQ calibration, such as arbitrating use of a shared external resistance RZQ among the memory devices of the ZQ group for ZQ calibration.

In some embodiments of the disclosure, a memory device of a ZQ group may be designated as a ZQ master by setting the corresponding bit(s) of a mode register of the particular memory device. A mode register write command may be issued to the memory device to set the bit(s) corresponding to the ZQ Master setting. For example, with reference to the mode register 400 of FIG. 4, the ZQ Master of OP[6] may be set to a "1" to designate the memory device as the ZQ master. A memory device of each of the ZQ groups of a semiconductor device may then be designated as the ZQ master for the respective ZQ group.

Certain details are set forth above to provide a sufficient understanding of described embodiments. However, it will be clear to one skilled in the art that embodiments may be practiced without these particular details. The description herein, in connection with the appended drawings, describes example configurations and does not represent all the examples that may be implemented or that are within the scope of the claims. The terms "exemplary" and "example" as may be used herein means "serving as an example, instance, or illustration," and not "preferred" or "advantageous over other examples." Additionally, terms such as "couples" and "coupled" mean that two components may be directly or indirectly electrically coupled. Indirectly coupled may imply that two components are coupled through one or more intermediate components. The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The functions described herein may be implemented in hardware, software executed by a processor, firmware, or any combination thereof. If implemented in software executed by a processor, the functions may be stored on or transmitted over as one or more instructions or code on a computer-readable medium. Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), or optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Combinations of the above are also included within the scope of computer-readable media.

Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing it will be appreciated that, although specific embodiments have been described herein for purposes of illustration, various modifications may be made while remaining with the scope of the claimed technology. The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    setting an impedance identification mode of a target memory device of a plurality of memory devices; and
    checking respective identification flags of the plurality of memory devices to determine which memory devices of the plurality of memory devices have set the respective identification flag responsive to setting the identification mode of the target memory device of the plurality of memory devices.

2. The method of claim 1, further comprising setting the identification mode of a second target memory device of the plurality of memory devices, wherein the second target memory device is a memory device of the plurality of memory devices not having a set identification flag responsive to setting the identification mode of the target memory device.

3. The method of claim 2, further comprising setting the identification mode of a third target memory device of the plurality of memory devices, wherein the third target memory device is a memory device of the plurality of memory devices not having a set identification flag responsive to setting the identification mode of the target memory device and the second target memory device.

4. The method of claim 2, further comprising storing memory device information related to the memory devices having set identification flags responsive to setting the identification mode of the target memory device of the plurality of memory devices and related to the memory devices of the plurality of memory devices having set identification flags responsive to setting the identification mode of the second target memory device of the plurality of memory devices.

5. The method of claim 2 wherein a first group of memory devices includes the memory devices of the plurality of memory devices having set identification flags responsive to setting the identification mode of the target memory device of the plurality of memory devices and wherein a second group of memory devices includes the memory devices of the plurality of memory devices having set identification flags responsive to setting the identification mode of the second target memory device of the plurality of memory devices, the method further comprising:
    designating a memory device of the first group of memory devices as a first master memory device; and
    designating a memory device of the second group of memory devices as a second master memory device.

6. A method, comprising:
    transmitting a first signal indicative of an identification mode of a target memory device of a plurality of memory devices;
    receiving one or more second signals indicative of respective identification flags from the plurality of memory devices; and
    determining, based at least in part on receiving the one or more second signals, which memory devices of the plurality of memory devices have set the respective identification flag responsive to first signal and are included in an impedance group with the target memory.

7. The method of claim 6 wherein transmitting the first signal indicative of an identification mode of a target memory device of the plurality of memory devices comprises issuing a mode register write command to the target memory device to set a mode register operand corresponding to an identification mode setting.

8. The method of claim 6, further comprising issuing a mode register read command to the plurality of memory devices to cause the plurality of memory devices to transmit a respective mode register operand corresponding to the identification flag.

9. A method, comprising:
    providing an identification request to a plurality of memory devices over a communication channel to which the plurality of memory devices are coupled responsive to an identification mode being set;
    setting an identification flag; and
    providing a status of the identification flag responsive to receiving an identification request.

10. The method of claim 9, further comprising determining whether the identification mode is set.

11. The method of claim 10 wherein determining whether the identification mode is set comprises determining a value of an operand of a mode register corresponding to the identification mode.

12. The method of claim 9 wherein providing an identification request to a plurality of memory devices comprises providing the identification request on a communication channel coupled to each of the plurality of memory devices.

13. The method of claim 9 wherein the memory devices are coupled to a shared impedance terminal.

14. A method, comprising:
  receiving an identification request on a communication channel coupled to a plurality of memory devices, the plurality of memory devices coupled to a common impedance terminal;
  setting an identification flag responsive to the identification request; and
  providing a status of the identification flag responsive to receiving an identification request.

15. The method of claim 14 wherein setting the identification flag comprises setting an operand of a mode register corresponding to an identification flag.

16. The method of claim 15 wherein providing the status of the identification flag responsive to receiving an identification request comprises outputting the value of the operand of the mode register responsive to receiving the identification request.

17. The method of claim 14 wherein providing the status of the flag responsive to receiving an identification request comprises performing a mode register read operation to a mode register including an operand corresponding to the identification flag.

* * * * *